(12) United States Patent
Nozoe et al.

(10) Patent No.: US 7,309,908 B2
(45) Date of Patent: Dec. 18, 2007

(54) STANDARD CELL, SEMICONDUCTOR INTEGRATED CIRCUIT DEVICE OF STANDARD CELL SCHEME AND LAYOUT DESIGN METHOD FOR SEMICONDUCTOR INTEGRATED CIRCUIT DEVICE

(75) Inventors: Mitsushi Nozoe, Osaka (JP); Noriyuki Kimura, Osaka (JP); Mika Nakata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 88 days.

(21) Appl. No.: 11/142,378

(22) Filed: Jun. 2, 2005

(65) Prior Publication Data

US 2005/0270823 A1 Dec. 8, 2005

(30) Foreign Application Priority Data

Jun. 4, 2004 (JP) ............................. 2004-166661

(51) Int. Cl.
*H01L 23/552* (2006.01)
(52) U.S. Cl. ...................... 257/659; 257/208; 257/508; 257/758; 257/E27.011; 716/10; 716/17
(58) Field of Classification Search ................. 257/659
See application file for complete search history.

(56) References Cited

U.S. PATENT DOCUMENTS 5,223,733 A 6/1993 Doi et al.
5,619,048 A * 4/1997 Yokota et al. ............... 257/207
2003/0095429 A1 5/2003 Hirose et al.
2004/0145033 A1* 7/2004 McElvain .................... 257/659

FOREIGN PATENT DOCUMENTS

| CN | 1423335 A | 6/2003 |
|----|-----------|--------|
| JP | 2-121349 | 5/1990 |
| JP | 5-152290 | 6/1993 |
| JP | 2834156 B2 | 10/1998 |

OTHER PUBLICATIONS

Chinese Office Action, with English Translation, issued in Chinese Patent Application No. CN 2005100747650, mailed May 25, 2007.

* cited by examiner

*Primary Examiner*—Tu-Tu Ho
(74) *Attorney, Agent, or Firm*—McDermott Will & Emery LLP

(57) ABSTRACT

To prevent the potential inversion of a dynamic node attributed to the fact that any wiring line among standard cells as is made of a wiring layer at the same level as that of the dynamic node within a standard cell is laid in adjacency to the dynamic node.

In adjacency to a dynamic node 101 within a standard cell, shield wiring lines 102a and 102b which are made of wiring layers at the same level as that of the dynamic node are laid so as to prevent any wiring line among standard cells from passing in adjacency to the dynamic node. The shield wiring lines can be replaced with a shield region or a wiring inhibition region.

25 Claims, 6 Drawing Sheets

▨ : SECOND-LAYER METAL WIRING LAYER
⬚ : FIRST-LAYER METAL WIRING LAYER
⸬ : POLY-SILICON LAYER

- ▨ : DYNAMIC NODE MADE OF SECOND-LAYER METAL WIRING LAYER
- ⌐ ¬ : FIRST-LAYER METAL WIRING LAYER
- ▦ : POLY-SILICON LAYER
- ◨ : SHIELD REGION MADE OF SECOND-LAYER METAL WIRING LAYER
- ⊠ : CONTACT REGION BETWEEN SHIELD REGION AND VDD

▓ : SECOND-LAYER METAL WIRING LAYER
⌐ ⌐ : FIRST-LAYER METAL WIRING LAYER
⋯ : POLY-SILICON LAYER

STANDARD CELL, SEMICONDUCTOR INTEGRATED CIRCUIT DEVICE OF STANDARD CELL SCHEME AND LAYOUT DESIGN METHOD FOR SEMICONDUCTOR INTEGRATED CIRCUIT DEVICE

BACKGROUND OF THE INVENTION

1. Field of the Invention

The present invention relates to a standard cell, a semiconductor integrated circuit device of standard cell scheme and a layout design method for a semiconductor integrated circuit device.

2. Description of the Related Art

A standard cell scheme is one of techniques for designing a large-scale integrated circuit (LSI). In the standard cell scheme, the desired circuit is constructed by preparing a plurality of sorts of small-scale circuits, called "standard cells", in advance and then combining them. In a layout design for the LSI of the standard cell scheme, automatic arrangement and wiring which employ a software tool are performed. In the layout design of the automatic arrangement and wiring scheme, various circuits of different functions are constructed in a short time in such a way that the standard cells are arranged on a semiconductor substrate, and that the wiring among the standard cells is performed in accordance with specifications.

In the LSI based on the automatic arrangement and wiring in the prior art, wiring layers for wiring within the standard cells exists at lower layers, and wiring layers for the wiring among the standard cells is disposed at upper layers. Besides, in designing the LSI on the basis of the automatic arrangement and wiring, the standard cells are arranged so as to minimize a layout area, and the standard cells are thereafter interconnected using the upper wiring layers. Incidentally, there has been a standard cell which employs a dynamic circuit involving a precharge operation, not a static circuit, for the purposes of heightening an operating speed, reducing an area, and so forth (refer to, for example, P JP-A-2-121349 (U.S. Pat. No. 2,834,156)).

FIG. 5 is a circuit diagram showing the configuration of a 2-input AND circuit which is an example of the dynamic circuit. Referring to FIG. 5, letters A and B designate input signals, sign CLK designates a clock signal, and letter Q designates an output signal. Besides, reference numeral 101 (indicated by a thick line in the figure) designates a dynamic node. The dynamic node is a node whose potential falls into a floating state temporarily during an ordinary circuit operation, and which is susceptible to the potential variation of other wiring lines.

When the clock signal CLK is at a low level, a PMOS transistor (P1) is brought into an ON state, and the dynamic node 101 becomes a high level. This is called "precharge". On this occasion, the output signal Q becomes the low level. When the clock signal changes to the high level, the 2-input AND circuit changes as explained below, depending upon the states of the input signals A and B.

First, when both the input signals A and B are at the high level, an NMOS transistor (N3) to which the clock signal CLK is fed and NMOS transistors (N1, N2) to which the input signals A and B are respectively fed are all brought into the ON states. The dynamic node 101 changes to the low level. Accordingly, the output signal Q changes to the high level. Besides, when at least one of the input signals A and B is at the high level, the dynamic node 101 is kept at the high level.

With the dynamic circuit which employs such precharge, a higher operating speed of the circuit can be attained, but the following problem occurs: When capacitive coupling exists between the dynamic node inside the circuit and the wiring lines in the vicinity thereof, the dynamic node has its potential changed under the influence of the potential variation of the wiring lines during the circuit operation, to incur the lowering of the operating margin of the circuit, in turn, the malfunction of the circuit.

In this regard, there has been a method wherein the dynamic node is covered with a power source wiring line, on which the wiring line between the standard cells can be laid (refer to, for example, P JP-A-2-121349 (U.S. Pat. No. 2,834,156)). Owing to this method, a shield is provided between the dynamic node and the overlying wiring line, so that the dynamic node is not influenced by the signal change of the overlying wiring line. There has also been a method wherein a wiring inhibition region is provided over the dynamic node, and the automatic wiring of the overlying wiring line is performed so as not to overlap the inhibition region (refer to, for example, JP-A-5-152290). Owing to this method, the capacitive coupling between the dynamic node and the overlying wiring line can be eliminated.

In the related art, it was sufficient to eliminate only the capacitive coupling between the wiring layer for the wiring lines within the standard cells and the overlying layer thereof, as stated in Patent Document 1 or 2. The reason therefor was that, since the standard cells themselves were constructed in consideration of the influence of the capacitive coupling, the wiring lines within the standard cells posed no problem, and that the wiring lines among the cells were laid only in the overlying layer of the wiring lines within the standard cells, as the result of the automatic arrangement and wiring, so the prevention of only the influence of the overlying layer was sufficient.

In recent years, however, there has been developed a circuit wherein a wiring layer which is capable of performing both the wiring within standard cells and the wiring among the standard cells is provided in order to reduce a circuit area. This circuit is formed by utilizing a wiring structure of three or more layers. More specifically, a wiring layer for the wiring within the standard cells is existent, the wiring layer for both the "wiring within the standard cells" and the "wiring among the standard cells" is existent on the first-mentioned wiring layer, and the second-mentioned wiring layer is overlaid with a wiring layer for the wiring among the standard cells.

Further, in recent years, with the microfabrication of a standard cell process, the coupling capacitance between wiring lines arranged in adjacency within a wiring layer of identical level (termed "side coupling capacitance") has become more influential than the coupling capacitance between a certain wiring layer and the overlying layer (or underlying layer) thereof (termed "overlap capacitance").

In the case where the wiring layer for both the wiring within the standard cells and the wiring among the standard cells is disposed under such a situation, the wiring line between the standard cells is sometimes laid in adjacency to a dynamic node, as the result of the automatic arrangement and wiring. In this case, the side coupling capacitance appears between the dynamic node and the adjacent wiring line between the standard cells, the potential variation of the wiring line between the standard cells is transmitted to the dynamic node through the side coupling capacitance, and the potential of the dynamic node might be inverted (that is, the malfunction of the circuit might be incurred).

SUMMARY OF THE INVENTION

The present invention is to solve the problem mentioned above, and it has for its object to prevent the potential of a dynamic node from becoming unstable and to reliably prevent a circuit from malfunctioning, even in a case where the circuit which includes a node susceptible to the potential variation of another wiring line, such as the dynamic node of a dynamic circuit, is designed by an automatic arrangement and wiring scheme employing standard cells.

The standard cell of the present invention consists in a standard cell wherein a wiring layer of predetermined level can be used as either of a wiring line within the standard cell and a wiring line for interconnecting standard cells, comprising a predetermined node which is formed by performing wiring within the standard cell with the wiring layer of the predetermined level, and which is susceptible to a potential variation of another wiring line; and inhibition means for inhibiting arrangement of the wiring line for interconnecting the standard cells as is made of the wiring layer of the predetermined level, in the vicinity of the predetermined node.

The standard cell is a novel one which has been designed in consideration of the point of attaining the stabilization of the potential of the predetermined node which is susceptible to the potential variation of another wiring line. Accordingly, even when automatic arrangement and wiring are performed, the wiring line for interconnecting the standard cells is not disposed in the vicinity of the predetermined node, and a circuit is reliably prevented from malfunctioning.

In one aspect of the standard cell of the invention, the inhibition means is a shield wiring line whose potential does not change simultaneously with the predetermined node, a shield region whose potential does not change simultaneously with the predetermined node, or a wiring inhibition region in which arrangement of the wiring line for interconnecting the standard cells is inhibited; the shield wiring line, the shield region, or the wiring inhibition region being formed of the wiring layer of the predetermined level. In order to inhibit the disposition of the wiring line for interconnecting the standard cells, in the vicinity of the predetermined node, the standard cell is provided with any of the shield wiring line, the shield region and the wiring inhibition region.

In another aspect of the standard cell of the invention, the shield wiring line whose potential does not change simultaneously with the predetermined node, and which is formed of the wiring line of the predetermined level, is connected to a power source potential or a ground potential. The shield wiring line is connected to the power source line or the ground line, thereby to fix its potential. Thus, A.C. noise can be absorbed, and the potential of the predetermined node is stabilized.

Besides, in another aspect of the standard cell of the invention, the shield region whose potential does not change and which is made of the wiring layer of the predetermined level is formed over substantially the whole area of the standard cell. The shield region is disposed so as to cover substantially the whole area of the standard cell, whereby there is eliminated the possibility that the wiring line for interconnecting the standard cells will be disposed in the vicinity of the predetermined node, and a shield effect is more effective to stabilize the potential of the predetermined node.

Besides, in another aspect of the standard cell of the invention, the wiring inhibition region in which the arrangement of the wiring line for interconnecting the standard cells is inhibited is disposed with a predetermined area around a position of the predetermined node. The wiring inhibition region is disposed around the predetermined node in accordance with wiring rules within the standard cell, thereby to inhibit the laying of the wiring line for interconnecting the standard cells.

Besides, in another aspect of the standard cell of the invention, the predetermined node is that dynamic node of a dynamic circuit whose potential falls into a floating state temporarily during an operation. Since the dynamic node of the dynamic circuit keeps a high level owing to charges stored by precharge, its potential easily becomes unstable. Accordingly, the dynamic node is prevented from being influenced by the potential variation of another wiring line due to side coupling, and the circuit is reliably prevented from malfunctioning.

A semiconductor integrated circuit device of standard cell scheme according to the invention is a semiconductor integrated circuit device of standard cell scheme, which employs the standard cell of the invention, and which is subjected to a layout design by an automatic arrangement and wiring scheme. Since the protection of the predetermined node whose potential easily becomes unstable is attained, the semiconductor integrated circuit device does not undergo the malfunction of a circuit and has a high reliability.

In a layout design method for a semiconductor integrated circuit device according to the invention, the standard cell of the invention is automatically arranged on a semiconductor chip by an automatic arrangement and wiring scheme, and the wiring line for interconnecting the standard cells is automatically disposed avoiding the vicinity of the specified node or the dynamic node by the same. Since the standard cell itself is designed in consideration of the point of stabilizing the potential of the predetermined node, the wiring line for interconnecting the standard cells can be automatically disposed avoiding the vicinity of the specified node or the dynamic node. Therefore, the malfunction of a circuit does not occur.

In accordance with the present invention, a wiring line for interconnecting standard cells does not pass through the vicinity of a predetermined node (such as a dynamic node) within a standard cell, and hence, the coupling capacitance (side coupling capacitance) of the predetermined node with the wiring line for interconnecting the standard cells can be avoided. Accordingly, the predetermined node (such as a dynamic node) is prevented from being influenced by the voltage variation of the wiring line for interconnecting the standard cells. Therefore, the potential of the predetermined node (such as a dynamic node) can be prevented from being inverted, and a circuit can be reliably prevented from malfunctioning.

Even in such a case where a dynamic circuit is constructed in accordance with an automatic arrangement and wiring scheme by employing standard cells under the condition that wiring lines of identical level can be used as both the wiring lines within the cell and among the cells, the problem of the potential inversion of the dynamic node attributed to the side coupling capacitance can be effectively eliminated by a simple construction, for the reason that the standard cell itself has been designed in consideration of the point of stabilizing the potential of the predetermined node. Moreover, A.C. noise can be absorbed by providing a shield wiring line or a shield region. It is accordingly possible to attain the advantage that the predetermined node (such as a dynamic node) can be protected from electromagnetic noise, etc.

DESCRIPTION OF THE PREFERRED EMBODIMENTS

First Embodiment

Figure 1:
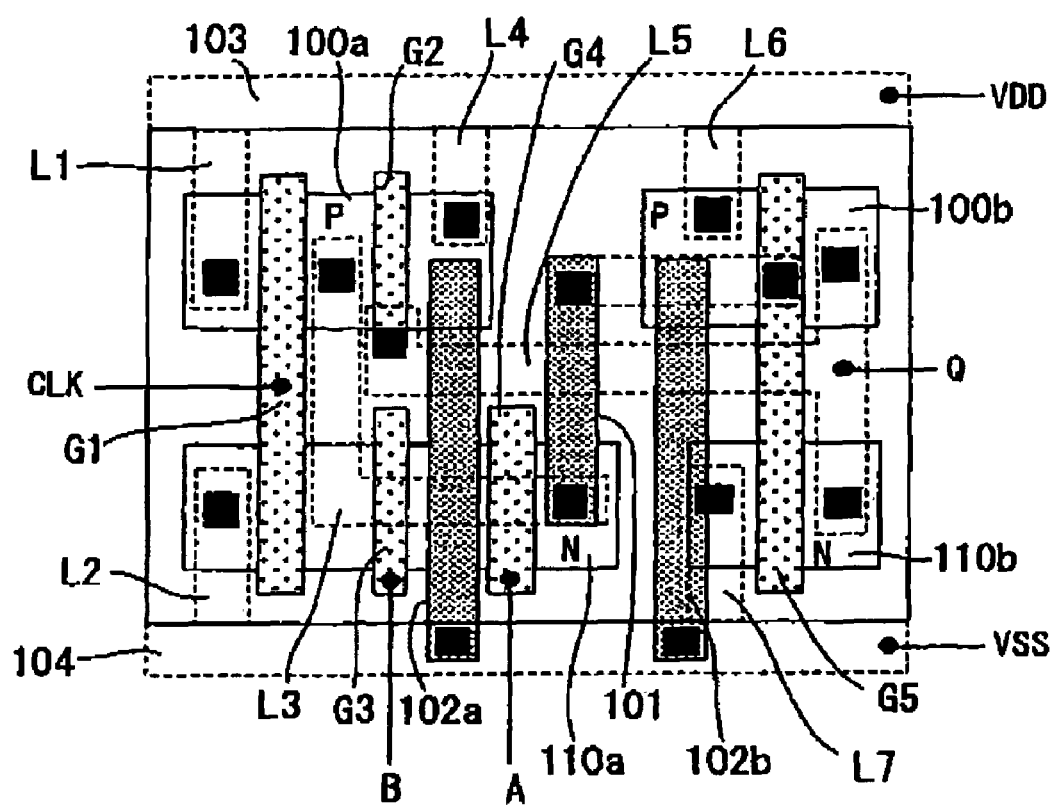
FIG. 1 is a layout diagram showing an example of the arrangement of diffused regions, metal wiring layers, etc. in that standard cell of the present invention in which a dynamic 2-input AND circuit is constructed.
Figure 2:
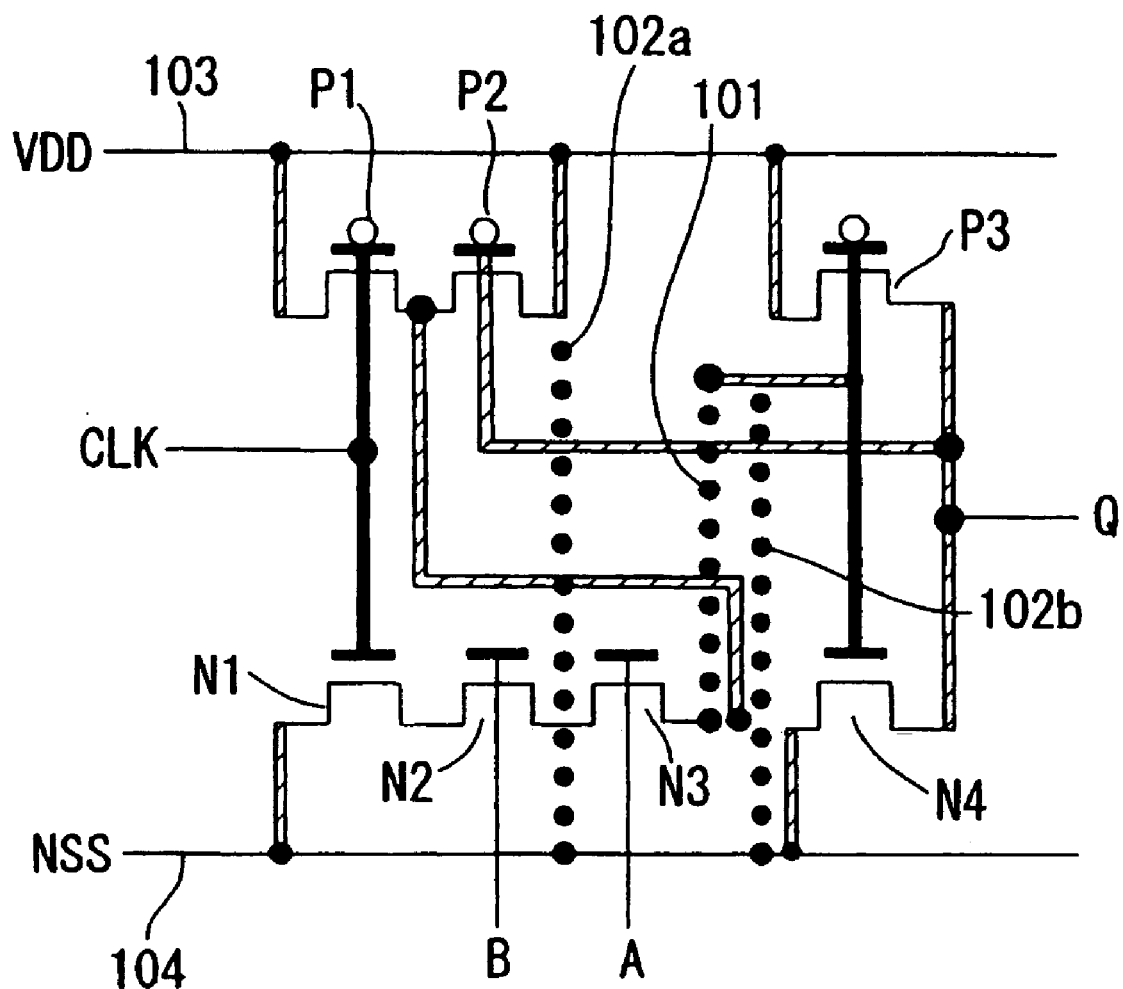
FIG. 2 is a circuit diagram showing the arrangement of transistors which constitute the dynamic 2-input AND circuit shown by the layout diagram in FIG. 1, and wiring lines which interconnect the transistors, together with the levels thereof.

FIG. 1 is a layout diagram showing an example of the arrangement of diffused regions, metal wiring layers, etc. in that standard cell of the present invention in which a dynamic 2-input AND circuit is constructed. FIG. 2 is a circuit diagram showing the arrangement of transistors which constitute the dynamic 2-input AND circuit shown by the layout diagram in FIG. 1, and wiring lines which interconnect the transistors, together with the levels thereof. FIGS. 1 and 2 are equivalent, and FIG. 2 is prepared in order to facilitate understanding the contents of the layout diagram in FIG. 1.

Figure 5:
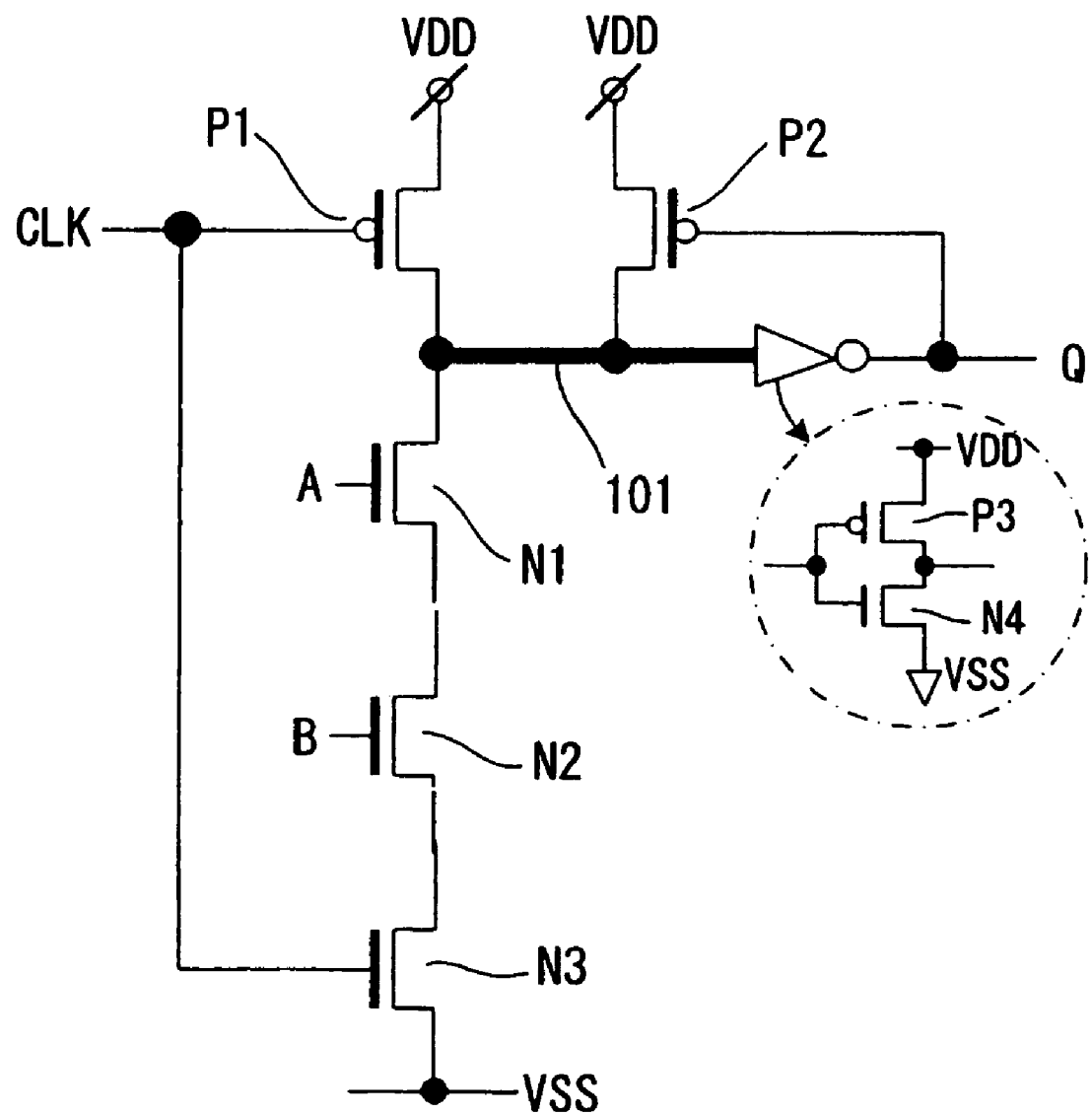
FIG. 5 is a circuit diagram showing the configuration of a 2-input AND circuit which is an example of a dynamic circuit.

The circuit shown in FIGS. 1 and 2 is the same as the dynamic 2-input AND circuit shown in FIG. 5 as explained before. In FIGS. 1 and 2, however, shield wiring lines (102a, 102b) fixed to a ground potential are respectively formed at the left and right of a dynamic node (101) in order to prevent the potential of the dynamic node (101) from becoming unstable (this point will be described later).

The conditions of wiring layout in this embodiment are as stated below. Poly-silicon layers, metal wiring layers of first layer, and metal wiring layers of second layer are used as wiring layers for wiring within the standard cell. Also, the metal wiring layers of the second layer, and wiring layers of overlying layer (third-layer wiring: not shown in FIG. 1) are used as wiring layers for connecting standard cells. Besides, in automatic arrangement and wiring, the plurality of standard cells including the standard cell in FIG. 1 are arranged, and the arranged cells are thereafter wired. As stated above, the metal wiring layers of the second layer, and the wiring layers of the overlying layer (third-layer wiring: not shown in FIG. 1) are employed for the wiring among the cells. The metal wiring layers of the second layer are employed for both the "wiring within the standard cell" and the "wiring among the standard cells". Incidentally, the standard cells for use in this embodiment are fabricated using CMOS (complementary type transistor which is constructed by complementarily combining a PMOS transistor and an NMOS transistor) technology.

The layout configuration of elements and wiring lines shown in FIG. 1 will be described. As shown in the figure, a VDD wiring line (103) and a VSS wiring line (104) are respectively laid at the upper and lower parts of the standard cell so as to extend in parallel with each other. Also provided are P-type diffused layers 100a and 100b which construct the source and drain of a PMOS transistor, respectively, and N-type diffused layers 110a and 110b which construct the source and drain of an NMOS transistor, respectively. Besides, poly-silicon layers G1-G5 which function as the gates of the MOS transistors (and wiring lines for connecting the gates) are provided in a vertical direction. The layer G1 is the gate which is fed with a clock (CLK), and the layers G4 and G3 are gates which are respectively fed with signals A and B.

Besides, the first-layer metal wiring layers L1-L7 are provided. Further, the second-layer metal wiring layers (101, 102a, 102b) are provided. Here, the second-layer metal wiring layer 101 constructs the dynamic node (part indicated by the thick line in FIG. 5). The second-layer metal wiring layers 102a and 102b are the shield wiring lines which are connected to the VSS potential (power source potential on a low level side). The second-layer metal wiring layers 102a and 102b function as means for inhibiting the disposition of any wiring line among the standard cells in the vicinity of the dynamic node (second-layer metal wiring layer) 101 during the automatic arrangement and wiring.

Next, the equivalent circuit diagram shown in FIG. 2 will be referred to. In FIG. 2, in order to facilitate understanding, the poly-silicon layers are indicated by thick solid lines, the first-layer metal wiring layers are indicated by hatched thick lines, the second-layer metal wiring layers are indicated by thick dotted lines, and the VDD wiring line 103 and the VSS wiring line 104 are indicated by solid lines of ordinary thickness. Reference signs (P1-P3, N1-N4) assigned to the individual transistors correspond to the transistors in the circuit diagram of FIG. 5.

In FIG. 2, the dynamic node 101 is laid in the vertical direction, and the shield wiring lines (102a, 102b) whose potentials are fixed to the potential VSS are laid at the left and right of the dynamic node 101 and in the vicinity of this dynamic node 101. The shield wiring lines (102a, 102b) are not indispensable constituents for constructing the dynamic 2-input AND circuit in FIG. 5, but in this embodiment, they are provided in order to inhibit the disposition of any wiring line among the standard cells in the vicinity of the dynamic node (second-layer metal wiring layer) 101 during the automatic arrangement and wiring. The shield wiring lines (102a, 102b) are made of the wiring layers at the same level as that of the dynamic node 101 (second-layer metal wiring layer) (that is, the second-layer metal wiring layers). The shield wiring lines (102a, 102b) function also to heighten an electromagnetic shield effect.

Next, the shield wiring lines (102a, 102b) will be concretely described. As stated above, in the standard cell in FIGS. 1 and 2, the shield wiring lines (102a, 102b) are drawn at positions adjacent to the dynamic node 101. The shield wiring lines 102 are connected to the VSS potential so as to prevent their potentials from fluctuating. The wiring interval between the dynamic node 101 and the shield wiring line 102a or 102b may be a sufficiently small distance to the extent that any wiring line for interconnecting the standard cells cannot be laid between the two wiring lines. The shield wiring lines 102a and 102b may well be connected to the VDD potential, not to the VSS potential.

Besides, in a case where the signal line of a signal as does not change simultaneously with the dynamic node 101, for example, the signal line of a mode changeover signal for a test, exists within the standard cell, such a signal line may well be employed as a shield wiring line. Besides, in the example of FIGS. 1 and 2, the two shield wiring lines are provided, and both are connected to the VSS potential, but similar advantages are attained even with a configuration in which one of the shield wiring lines is connected to the VDD potential, while the other is connected to the VSS potential. Also, similar advantages are attained even in a case where the signal line of the testing mode changeover signal or the like signal line which does not change simultaneously with the dynamic node is employed as one shield wiring line, and where the other shield wiring line is connected to the VDD or VSS potential. Important is that the potentials of the shield wiring lines do not change during the operation of the dynamic node.

Besides, although the shield wiring lines (102a, 102b) are drawn on both the sides of the dynamic node 101 in the example of FIGS. 1 and 2, similar advantages can be attained by providing an adjacent shield wiring line on only one side of the dynamic node 101 in a case, for example, where the wiring line other than the dynamic node 101 within the standard cell passes in adjacency to the dynamic node 101 within the same wiring layer as that of the dynamic node 101.

Figure 6:
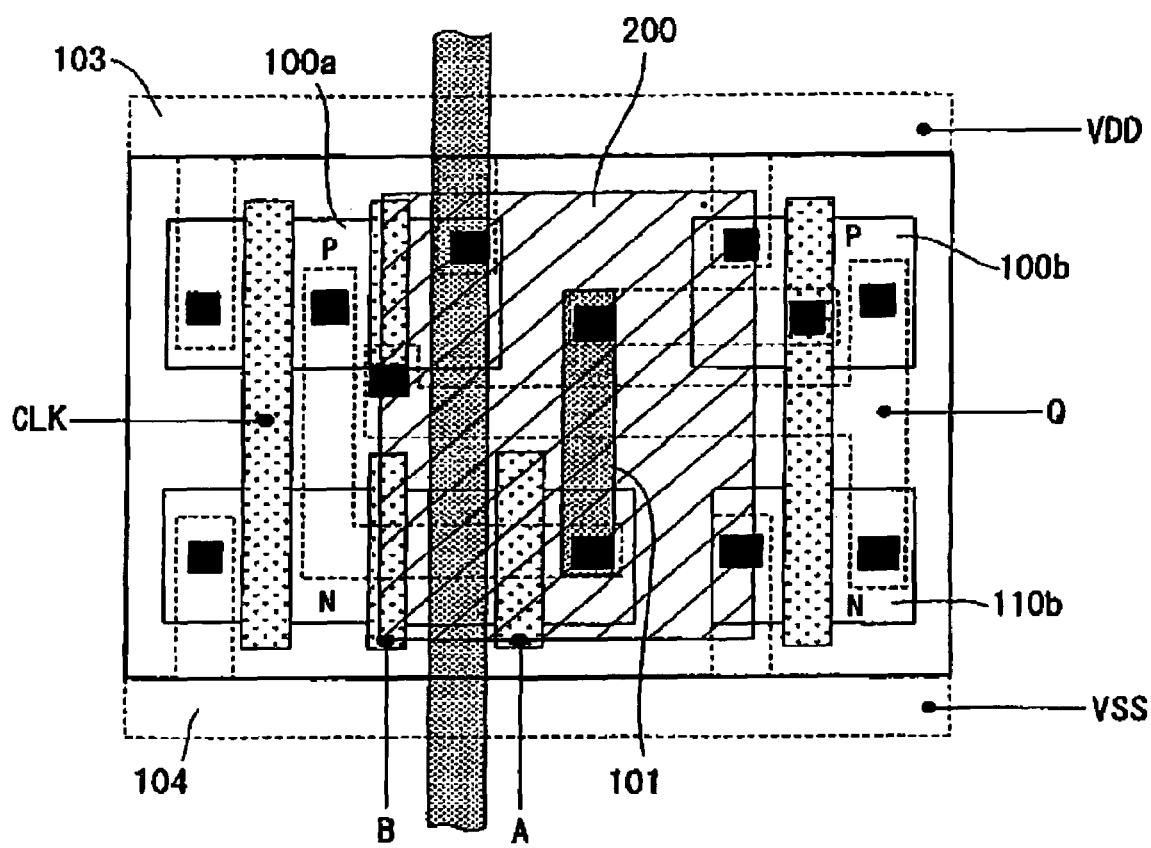
FIG. 6 is a layout diagram showing the layout configuration of a standard cell in which a dynamic 2-input AND circuit is formed, in a comparative example (example where any shield wiring line is not provided within the cell).

Next, the advantages of the shield wiring lines will be described with reference to a comparative example shown in FIG. 6. FIG. 6 is a layout diagram showing the layout configuration of a standard cell in which a dynamic 2-input AND circuit is formed, in the comparative example (example where any shield wiring line is not provided within the cell). In the standard cell of FIG. 6, poly-silicon layers, first metal wiring layers, and second metal wiring layers overlying the first metal wiring layers are included as wiring layers for wiring within the standard cell. The second metal wiring layers are also employed for wiring among standard cells. This point is the same as in FIG. 1. Reference numerals and signs used are also the same as in FIG. 1. Besides, in FIG. 6, a third-layer wiring line 200 is shown.

In the case of the dynamic cell of FIG. 6, the protection of the dynamic node 101 is not satisfactory in spite of the provision of the shield wiring line 200 which is made of the wiring layer overlying the dynamic node 101 (second metal wiring layer), that is, a third-layer metal wiring layer. More specifically, the second-layer metal wiring layer is also used as the wiring line 104 among the standard cells. Therefore, when the standard cells are to be wired, the wiring line among the standard cells (wiring line for interconnecting the standard cells), 104 (second metal wiring layer at the same level as that of the dynamic node 101) might be laid in adjacency to the dynamic node 101. In this case, a side coupling capacitance appears between the dynamic node 101 and the wiring line among the standard cells, 104, so that when the dynamic node 101 changes, the dynamic circuit might malfunction under the influence of the signal change (potential variation) of the wiring line among the standard cells, 104.

In contrast, the shield wiring lines 102 which are made of the second metal wiring layers at the same level as that of the dynamic node 101 are provided in the vicinity of the dynamic node 101 as shown in FIGS. 1 and 2, whereby any wiring line among the standard cells as is made of the wiring layer at the same level as that of the dynamic node is prevented from passing through the vicinity of the dynamic node, and the side coupling capacitance of the dynamic node with the wiring line among the standard cells can be reliably avoided. Consequently, the potential of the dynamic node is prevented from fluctuating, and the dynamic circuit can be prevented from malfunctioning.

Second Embodiment

Figure 3:
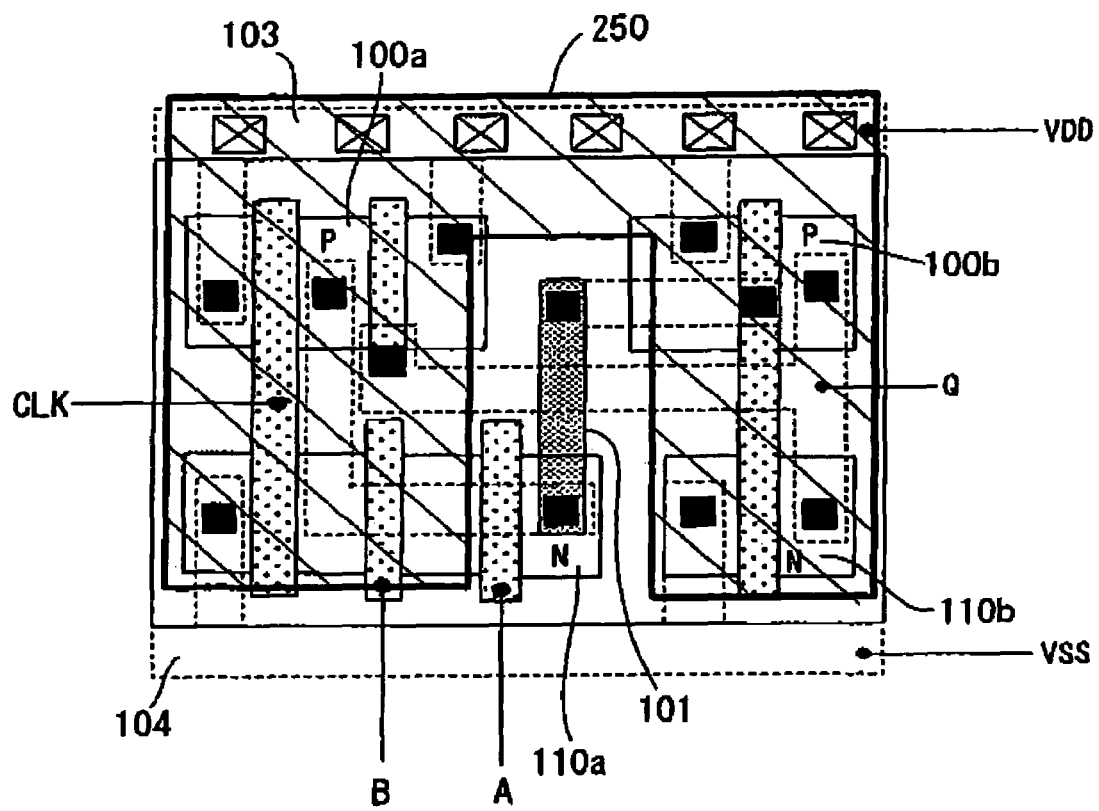
FIG. 3 is a layout diagram showing another example of the arrangement of diffused regions, metal wiring layers, etc. in that standard cell of the invention in which a dynamic 2-input AND circuit is constructed.

FIG. 3 is a layout diagram showing another example of the arrangement of diffused regions, metal wiring layers, etc. in that standard cell of the invention in which a dynamic 2-input AND circuit is constructed. In this embodiment, "shield wiring lines" are replaced with a "shield region" of larger area. In FIG. 3, identical reference numerals and signs are assigned to portions common to those in the foregoing drawings, and layout conditions are the same as in the foregoing embodiment.

In FIG. 3, the shield region 250 which is made of a second-layer metal wiring layer at the same level as that of the dynamic node 101 is provided. The shield region 250 is disposed over substantially the whole area of the standard cell so as to surround the dynamic node 101. The shield region 250 is connected to the VDD wiring line (103) through a plurality of contact regions. As the shield region 250, the same material (for example, aluminum) as that of the metal wiring lines is spread all over a predetermined region.

Also in this embodiment, as in the foregoing embodiment, any wiring line among the standard cells is prevented from passing in adjacency to the dynamic node 101, in automatic arrangement and wiring, so that a side coupling capacitance is avoidable. Accordingly, the dynamic circuit can be reliably prevented from malfunctioning. Besides, since the shield region 250 disposed over substantially the whole area functions also as electromagnetic shield means, it positively serves to stabilize the potential of the dynamic node 101. Incidentally, even when the shield region 250 is connected to the VSS wiring line 104, similar advantages are attained.

Third Embodiment

Figure 4:
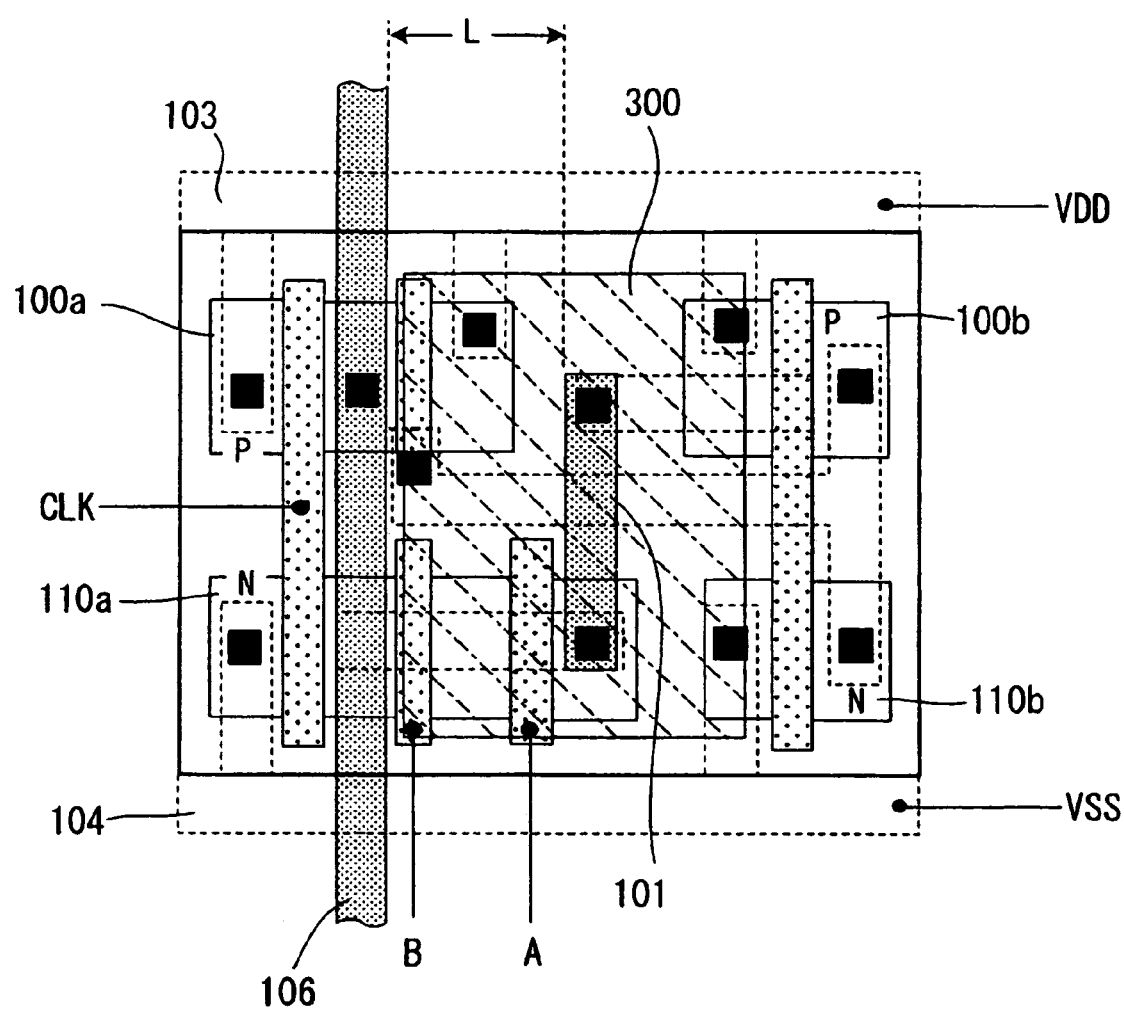
FIG. 4 is a layout diagram showing another example of the arrangement of diffused regions, metal wiring layers, etc. in that standard cell of the invention in which a dynamic 2-input AND circuit is constructed.

FIG. 4 is a layout diagram showing another example of the arrangement of diffused regions, metal wiring layers, etc. in that standard cell of the invention in which a dynamic 2-input AND circuit is constructed. In this embodiment, shield wiring lines or a shield region are/is replaced with a "wiring inhibition region", thereby to attain the same advantages as in each of the foregoing embodiments.

In FIG. 4, the dynamic node 101 is surrounded with the region (wiring inhibition region) 300 which has a predetermined area, which is made of a wiring layer (second metal wiring layer) at the same level as that of the dynamic node 101 and which inhibits the laying of another wiring line (that is, any wiring line for interconnecting the standard cells). In automatic arrangement and wiring, therefore, the wiring line for interconnecting the standard cells (second-layer wiring layer) does not pass through a region which is adjacent to the dynamic node 101 (a region which is so close that the coupling of the dynamic node with another wiring line due to side coupling poses a problem).

In FIG. 4, the wiring line among the standard cells, 106 is laid at a position which is at a distance L from the dynamic node 101. In this embodiment, the shield wiring lines or the shield region do/does not exist between the dynamic node 101 and the wiring line among the standard cells, 106, so that a side coupling capacitance might appear. Since, however, the dynamic node 101 and the wiring line among the standard cells, 106 are not adjacent (they are sufficiently distant), the side coupling capacitance can be suppressed to a sufficiently small value. Accordingly, influence which the wiring line among the standard cells, 106 exerts on the dynamic node 101 is slight. That is, the potential fluctuation of the dynamic node 101 attributed to the side coupling is not apprehended. Incidentally, the wiring inhibition region may be disposed over the whole area within the standard cell, or it may well be disposed in only a region which is adjacent to the dynamic node or the like specified node. The wiring inhibition region can be freely set by altering wiring rules at the automatic arrangement and wiring.

Although the invention has thus far been described in conjunction with the embodiments, the invention is not restricted to them, but it is capable of various modifications within a scope not departing from the purport thereof. By way of example, although the cell including the dynamic circuit has been exemplified above, noise which the wiring line among the standard cells inflicts on a specified node within the standard cell can, of course, be reduced even in case of a static circuit by providing the shield wiring lines, the shield region or the wiring inhibition region in the wiring layers in which both the wiring lines within the standard cell and the wiring line among the standard cells are formed as in the second-layer metal wiring layers in each of FIGS. 1-4. Since, however, the dynamic node is susceptible to the change of the signal of the adjacent wiring line, it is especially effective to lay the shield wiring lines in adjacency to the dynamic node.

With the standard cell of the present invention, any wiring line for interconnecting standard cells is prevented from passing through the vicinity of a predetermined node (such as dynamic node) within the standard cell, so that the coupling capacitance (side coupling capacitance) of the node with the wiring line for interconnecting the standard cells can be avoided. Accordingly, the predetermined node (such as dynamic node) is prevented from being influenced by the voltage variation of the wiring line for interconnecting the standard cells. Therefore, the invention has the advantage that the potential of the predetermined node (such as dynamic node) can be prevented from being inverted, and that a circuit can be reliably prevented from malfunctioning, and it is useful for the standard cell, a semiconductor integrated circuit device of standard cell scheme and a layout design method for a semiconductor integrated circuit device.

What is claimed is:

1. A standard cell, wherein a wiring layer of predetermined level can be used as at least one of a wiring line within the standard cell and a wiring line for interconnecting standard cells, comprising:
   a predetermined node, formed by performing wiring within the standard cell with the wiring layer of the predetermined level, and which is susceptible to a potential variation of another wiring line; and
   a shield wiring line whose potential does not change simultaneously with the predetermined node, a shield region whose potential does not change simultaneously with the predetermined node, or a wiring inhibition region in which arrangement of the wiring line for interconnecting the standard cells is inhibited; the shield wiring line, the shield region, or the wiring inhibition region being formed of the wiring layer of the predetermined level and inhibiting arrangement of the wiring line for interconnecting the standard cells as is made of the wiring layer of the predetermined level, in the vicinity of the predetermined node,
   wherein the predetermined node and the shield wiring line, the shield region, or the wiring inhibition region are formed within the standard cell.

2. The standard cell according to claim 1, wherein:
   the shield wiring line whose potential does not change simultaneously with the predetermined node, and which is formed of the wiring line of the predetermined level, is connected to a power source potential or a ground potential.

3. The standard cell according to claim 1, wherein the shield region whose potential does not change and which is made of the wiring layer of the predetermined level is formed over substantially a whole area of the standard cell.

4. The standard cell according to claim 1, wherein:
   the wiring inhibition region in which the arrangement of the wiring line for interconnecting the standard cells is inhibited is disposed with a predetermined area around a position of the predetermined node.

5. The standard cell according to any of claims 1 through 4, wherein:
   the predetermined node is that dynamic node of a dynamic circuit whose potential falls into a floating state temporarily during an operation.

6. A semiconductor integrated circuit device of standard cell scheme, which employs the standard cell according to any of claims 1 through 4, and which is subjected to a layout design by an automatic arrangement and wiring scheme.

7. A layout design method for a semiconductor integrated circuit device, wherein the standard cell according to any of claims 1 through 4 is automatically arranged on a semiconductor chip by an automatic arrangement and wiring scheme, and that the wiring line for interconnecting the standard cells is automatically disposed avoiding a vicinity of the specified node or the dynamic node by the same.

8. A semiconductor integrated circuit device of standard cell scheme, which employs the standard cell according to claim 5, and which is subjected to a layout design by an automatic arrangement and wiring scheme.

9. A layout design method for a semiconductor integrated circuit device, wherein the standard cell according to claim 5 is automatically arranged on a semiconductor chip by an automatic arrangement and wiring scheme, and that the wiring line for interconnecting the standard cells is automatically disposed avoiding a vicinity of the specified node or the dynamic node by the same.

10. The standard cell according to claim 1, wherein the shield wiring line or the shield region is formed by the wiring line within the standard cell.

11. A standard cell, wherein a wiring layer of a predetermined level can be used as at least one of a wiring layer within the standard cell and a wiring layer for interconnecting standard cells, comprising:
   a predetermined node, formed in the wiring layer of the predetermined level; and
   an inhibitor in the wiring layer of the predetermined level, formed along the predetermined node,
   wherein there is no wiring line for interconnecting the standard cells between the predetermined node and the inhibitor in the wiring layer of the predetermined level, and
   the predetermined node and the inhibitor are formed within the standard cell.

12. The standard cell according to claim 11, wherein the inhibitor is a shield wiring line whose potential does not change simultaneously with the predetermined node.

13. The standard cell according to claim 12, wherein the shield wiring line whose potential does not change simultaneously with the predetermined node, and which is formed of the wiring line of the predetermined level, is connected to a power source potential or a ground potential.

14. A standard cell, wherein a wiring layer of a predetermined level can be used as at least one of a wiring layer within the standard cell and a wiring layer for interconnecting standard cells, comprising:
a predetermined node, formed in the wiring layer of the predetermined level; and
an inhibitor in the wiring layer of the predetermined level, formed as the nearest wiring line to the predetermined node among the wiring lines of the predetermined level,
wherein the predetermined node and the inhibitor are formed within the standard cell.

15. The standard cell according to claim 14, wherein the inhibitor is a shield wiring line whose potential does not change simultaneously with the predetermined node.

16. The standard cell according to claim 15, wherein the shield wiring line whose potential does not change simultaneously with the predetermined node, and which is formed of the wiring line of the predetermined level, is connected to a power source potential or a ground potential.

17. A standard cell, wherein a wiring layer of a predetermined level can be used as at least one of a wiring layer within the standard cell and a wiring layer for interconnecting standard cells, comprising:
a predetermined node, formed in the wiring layer of the predetermined level; and
an inhibitor in the wiring layer of the predetermined level, formed around the predetermined node,
wherein there is no wiring line for interconnecting the standard cells between the predetermined node and the inhibitor in the wiring layer of the predetermined level, and
the predetermined node and the inhibitor are formed within the standard cell.

18. The standard cell according to claim 17, wherein the inhibitor is formed around the predetermined node through a plurality of contact regions.

19. The standard cell according to claim 17, wherein the inhibitor is a shield region whose potential does not change simultaneously with the predetermined node.

20. The standard cell according to claim 19, wherein the shield region whose potential does not change and which is made of the wiring layer of the predetermined level is formed over substantially a whole area of the standard cell.

21. A standard cell, wherein a wiring layer of a predetermined level can be used as at least one of a wiring layer within the standard cell and a wiring layer for interconnecting standard cells, comprising:
a predetermined node, formed in the wiring layer of the predetermined level; and
a wiring inhibition region in the wiring layer of the predetermined level,
wherein there is no wiring line for interconnecting the standard cells in the wiring inhibition region, and
the predetermined node and the wiring inhibition region are formed within the standard cell.

22. The standard cell according to claim 21, wherein the wiring inhibition region in which the arrangement of the wiring line for interconnecting the standard cells is inhibited is disposed with a predetermined area around a position of the predetermined node.

23. A standard cell, wherein a wiring layer of a predetermined level can be used as at least one of a wiring layer within the standard cell and a wiring layer for interconnecting standard cells, comprising:
a predetermined node, formed in the wiring layer of the predetermined level; and
an inhibitor, inhibiting an arrangement of a wiring line for interconnecting the standard cells as is made of the wiring layer of the predetermined level, in the vicinity of the predetermined node,
wherein both the predetermined node and the inhibitor are in the same wiring layer of the predetermined level and are formed within the standard cell.

24. The standard cell according to claim 11, 14, 17 or 23, wherein the predetermined node and the inhibitor are formed by the wiring line within the standard cell.

25. The standard cell according to claim 21, wherein the predetermined node is formed by the wiring line within the standard cell.

* * * * *